(12) United States Patent
Olson et al.

(10) Patent No.: US 6,331,494 B1
(45) Date of Patent: Dec. 18, 2001

(54) DEPOSITION OF LOW DIELECTRIC CONSTANT THIN FILM WITHOUT USE OF AN OXIDIZER

(75) Inventors: Darin Scott Olson, Menlo Park; T. S. Ravi, San Jose, both of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/474,844

(22) Filed: Dec. 30, 1999

(51) Int. Cl.[7] ................................. H01L 21/469
(52) U.S. Cl. .................. 438/770; 438/513; 438/765; 438/772; 438/778; 438/787; 438/788; 438/790
(58) Field of Search .................. 438/513, 765, 438/770, 772, 778, 787, 788, 790

(56) References Cited

U.S. PATENT DOCUMENTS 5,314,724 * 5/1994 Tsukune et al. .
5,521,126 * 5/1996 Okamura et al. .
5,593,741 * 1/1997 Ikeda .
5,779,925 * 7/1998 Hashimoto et al. .

* cited by examiner

Primary Examiner—Long Pham
(74) Attorney, Agent, or Firm—Lathrop & Gage L.C.; Thomas Swenson

(57) ABSTRACT

An organic precursor compound is gasified and fed into the reaction chamber of a high density plasma chemical vapor deposition (HDP-CVD) reactor. The organic precursor comprises silicon, oxygen and carbon atoms. No reactive oxygen gas or other oxidizer is used in the reaction chamber. A thin film of carbon-containing low dielectric constant silicon oxide material is deposited and simultaneously etched in the reaction chamber to fill a gap having a high aspect ratio with low dielectric constant insulator material.

39 Claims, 6 Drawing Sheets

DEPOSITION OF LOW DIELECTRIC CONSTANT THIN FILM WITHOUT USE OF AN OXIDIZER

BACKGROUND OF THE INVENTION

1. Field of the Invention

The invention relates to a method and precursors for forming low dielectric constant insulator material in integrated circuits.

2. Statement of the Problem

As semiconductor technology advances, circuit elements and interconnections on wafers or silicon substrates become increasingly more dense. As a result of the continuing trend toward higher device densities, parasitic interdevice currents are increasingly problematic. In order to prevent unwanted interactions between these circuit elements, insulator-filled gaps, or trenches, located between active circuit devices and metallized interconnect layers are provided to physically and electrically isolate the elements and conductive lines. However, as circuit densities continue to increase, the widths of these gaps decrease, thereby increasing gap aspect ratios, typically defined as the gap depth divided by the gap width. As the gaps become narrower, parasitic capacitance increases, and filling the gaps with insulating material becomes more difficult. This can lead to unwanted voids and discontinuities in the insulating, or gap-fill, material.

For example, in metal-oxide-semiconductor ("MOS") technology, it is necessary to provide an isolation structure that prevents parasitic channel formation between adjacent devices, such devices being primarily NMOS and PMOS transistors or CMOS circuits. Trench isolation technology has been developed in part to satisfy such insulation needs. Refilled trench structures essentially comprise a recess formed in the silicon substrate that is refilled with a dielectric insulating material. Such structures are fabricated by first forming submicron-sized trenches in the silicon substrate, usually by a dry anisotropic etching process. The resulting trenches typically display a steep side-wall profile. The trenches are subsequently refilled with a dielectric, such as silicon dioxide, typically by a chemical vapor deposition ("CVD") technique. They are then planarized by an etchback process so that the dielectric remains only in the gap, its top surface level with that of the silicon substrate. The resulting filled-trench structure functions as a device isolator having excellent planarity and potentially high aspect ratio beneficial for device isolation. Refilled trench isolation can take a variety of forms depending upon the specific application; they are generally categorized in terms of the trench dimensions: shallow trenches (<1 $\mu$m), moderate depth trenches (1 $\mu$m to 3 $\mu$m), and deep, narrow trenches (>3 $\mu$m deep, <2 $\mu$m wide). Shallow Trench Isolation (STI) is used primarily for isolating devices of the same type in increasingly dense MOS circuits. STI provides a high degree of surface planarity.

Similar isolation techniques are used to separate closely spaced circuit elements that have been formed on or above a semiconductor substrate during integrated circuit fabrication. The circuit elements may be active devices or conductors, and are isolated from each other by refilled "gaps".

The basic trench, or gap, isolation process is, however, subject to drawbacks, one of these being void formation in the gap during dielectric gap fill. Such voids are formed when the gap-filling dielectric material forms a constriction near the top of the gap, preventing deposition of the material into the gap interior. Such voids compromise device isolation, as well as the overall structural integrity. Unfortunately, preventing void formation during gap fill often places minimum size constraints on the gaps themselves, which may compromise device packing density or device isolation.

Silicon dioxide is formed by conventional CVD techniques by mixing a gaseous oxidizer (e.g., $N_2O$), silane ($SiH_4$) and inert gases, such as argon, and energizing the mixture in a reactor so that the oxygen and silane react to form silicon dioxide on a wafer substrate. Currently, plasma-enhanced chemical vapor deposition ("PECVD") processes are used to fill gaps with silicon oxide material. In PECVD processes, a plasma of ionized gas is formed in the CVD plasma reactor. The plasma energizes the reactants, enabling formation of the desired silicon dioxide at lower temperatures than would be possible by adding only heat to the reactor system. In a typical plasma-enhanced CVD ("PECVD") process, the plasma is a low pressure reactant gas discharge that is developed in a radio-frequency ("rf") field. The plasma is an electrically neutral ionized gas in which there are equal number densities of electrons and ions. At the relatively low pressures used in PECVD, the electron energies can be quite high relative to heavy particle energies. The high electron energy increases the density of dissociated reactants within the plasma available for reaction and deposition at the substrate surface. The enhanced supply of reactive free radicals in the PECVD reactor enables the deposition of dense, good quality films at lower temperatures (e.g., 400° C.) and at faster deposition rates (30 nm/min to 40 nm/min) than typically achieved using only thermally-activated CVD processes (10 nm/min to 20 nm/min).

In addition to silane ($SiH_4$), other silicon-containing precursors have been used to form silicon dioxide, including disilane ($S_2H_6$) and tetraethoxysilane ("TEOS"). All of these processes require mixing the silicon-containing reactant with an oxidizing gas reactant, such as oxygen gas ($O_2$), ozone ($O_3$), nitrous oxide ($N_2O$), nitrogen dioxide ($NO_2$) or carbon dioxide ($CO_2$).

The capacitance across a gap is governed by the formula $$C = \in kA/t,$$

where C is the capacitance, $\in$ is the dielectric constant of the gap fill material, k is a constant, A is the area of the gap (i.e., the area of the side of the circuit element forming the gap), and t is the thickness or width of the gap. As gap widths decrease with increasing density, the capacitance across the dielectric gap fill material increases. Thus, as integrated circuits become increasingly dense, decreasing t, it is necessary to lower the dielectric constant of the gap fill material to reduce cross-talk, capacitive coupling and resulting speed degradation, and power consumption. To compensate for smaller gap dimensions, it is known to substitute dielectric materials having dielectric constants lower than silicon dioxide. It is known in the prior art to form halogen-doped silicon dioxide. For example, fluorinated silicon dioxide films possess a dielectric constant of approximately 3.2, whereas typical CVD-$SiO_2$ has a dielectric constant of about 3.9. It is also known to use multilayer or "sandwich" gap-fill material, including structures comprising a silicon dioxide layer and a non-silicon carbon-based layer or a polymer layer. Although these structures may possess an overall dielectric constant lower than silicon dioxide, their fabrication processes are slow, complex and expensive, and they are limited with respect to aspect ratios achieved.

Design feature widths of integrated circuit devices are currently approaching 0.25 μm, or 250 nm. To achieve corresponding overall circuit density, gap dimensions of approximately 100 nm to 400 nm gap width range and 300 nm to 1000 nm gap depth range are desired, having corresponding range of aspect ratios of 2 to 6. Furthermore, because the gap is so thin, the insulating gap material should have a dielectric constant of 3.3 or less.

A gap opening of 500 nm or less is too small for depositing material using conventional CVD and PECVD methods. Also, as the deposition of gap-filling material proceeds, the gap opening becomes smaller, making it more difficult to fill and creating the risk of void formation. Currently, high density plasma ("HDP") CVD is used to fill high aspect ratio gaps. Also, using HDP-CVD, it is usually possible to deposit silicon oxide films at lower temperatures (e.g., 150° C. to 250° C.) than in a PECVD process. Typical HDP-CVD processes use a gas mixture containing oxygen, silane, and inert gases, such as argon, to achieve simultaneous dielectric deposition and etching. In an HDP process, an rf bias is applied to a wafer substrate in a reaction chamber. Some of the gas molecules, particularly argon, are ionized in the plasma and accelerate toward the wafer surface when the rf bias is applied to the substrate. Material is thereby sputtered when the ions strike the surface.

It is known that carbon-containing silicon oxide films have lower dielectric constants than silicon oxide films. It is believed that the carbon works by decreasing the effective density of the film, since a film of zero density, that is, a vacuum, has a dielectric constant of 1. Also, carbon contained in silicon oxide films, for example, $CH_3$ groups, is usually less polarizable than silicon oxide, thereby lowering the capacitance, or dielectric constant, of the thin film.

It is known in the art to deposit a carbon-containing silicon oxide film by reacting an organic carbon-containing gaseous precursor compound, a silicon-containing gaseous precursor compound and an oxygen-containing oxidizing reactant gas ("oxidizer") in a PECVD or HDP-CVD process. The oxidizer serves to oxidize silicon atoms to form silicon oxides. The carbon-containing and the silicon-containing precursors may be the same organic precursor compound. The oxygen containing reactant gas may be oxygen gas ($O_2$), ozone ($O_3$), nitrous oxide ($N_2O$), nitrogen dioxide ($NO_2$), carbon dioxide ($CO_2$) or other oxidizer gas. During formation of the insulator film in conventional methods for forming silicon oxide films containing carbon, the reactive oxygen from the oxygen-containing reactant gas ("oxidizer") oxidizes both silicon atoms and carbon atoms. The reactive oxygen oxidizes the carbon present in both the deposited thin film and in the gaseous precursor. The products of the oxidation reaction include CO and $CO_2$, which are volatile gases that escape from the film. As a result, the deposited gap-fill film contains less carbon and has a higher dielectric constant than desired. Use of oxidizer gases less reactive than $O_2$ gas ameliorates the negative effects of carbon oxidation; yet, the problem of undesired oxidation of carbon persists.

Thus, there is a need for a method of depositing gap-filling insulator material for filling an insulator gap, or a trench, having an aspect ratio of 2 or greater and containing insulating material having a dielectric constant of 3.3 or less.

In addition to filling gaps, or trenches, between active devices or local interconnects, there is also a need for a low-dielectric constant insulator material for use as inter-layer dielectric ("ILD") and other insulating thin films in integrated circuit devices. For example, in damascene process techniques, the dielectric material is deposited as a blanket, either without or with minimal gap-fill requirements. Trenches or vias are then etched in this material, and these are filled with conductor material. Although the dielectric material is deposited first, and conductive material is used to fill the gaps, nevertheless the need for a low dielectric blanket material between circuit elements is similar to the described requirement for a low-dielectric constant gap-fill material.

Solution

The invention provides a novel method and novel precursors for depositing an oxide thin film, particularly a low dielectric constant oxide thin film, in integrated circuit applications. In accordance with the invention, a reactant gas mixture reacts in a plasma-enhanced CVD process without the addition of an oxygen-containing reactant gas ("oxidizer") to form a low dielectric constant oxide thin film. Typically, the reactant gas mixture contains silicon, oxygen and carbon for forming a carbon-containing silicon oxide layer. In contrast with conventional methods, which add a separate oxygen-containing oxidizer gas to the reactor chamber to oxidize silicon, a method in accordance with the invention does not comprise the addition of $O_2$ or $N_2O$ or other oxidizer gases to the reaction chamber or to the reactant gas mixture of the CVD process.

The reactant gas mixture in accordance with the invention typically comprises a gasified organic precursor compound containing silicon, oxygen and carbon. Thus, the oxygen for forming the silicon oxide of the dielectric thin film is provided in the organic precursor of the invention. Since the oxygen in the precursor is chemically bound with the silicon, it is relatively unreactive, compared with oxygen atoms of $O_2$, ozone, $N_2O$ and other oxidizers commonly used in conventional CVD processes. As a result, the method avoids oxidation of the carbon in the precursor and in the deposited thin film. The carbon in the thin film is chemically stable, typically in the form of an alkyl group, such as —$CH_3$, and other carbon-containing groups. Since there is no reactive oxidizing gas added to the CVD reaction chamber, the only reacting oxygen comes from the precursor. The plasma oxygen concentration is lower, so volatile carbon compounds, such as $CO_2$ or CO, do not form and volatilize as much as if a reactive oxidizing gas were present. Also, since the oxygen atoms are bound, they do not react with hydrogen atoms that may be present, forming undesired OH-groups or water, which would increase the dielectric constant. A carbon-containing silicon oxide thin film made in accordance with the invention has a dielectric constant value less than undoped silicon oxides. The dielectric constant is virtually always less than 4, and typically less than 3.5 or less than 3.0.

Preferably, the gaseous precursor stream flowed into the CVD reactor contains an organic precursor compound comprising silicon, oxygen and carbon. The preferred organic precursor compound of the invention is octamethylcyclotetrasiloxane, corresponding to the stoichiometric formula $(SiO(CH_3)_2)_4$. Other oxygen-containing organic precursor compounds may be used to form oxide thin films, especially low dielectric constant thin films, in a method in which no oxidizer is added to the reactant gas mixture or to the reaction chamber. An organic precursor compound in accordance with the invention comprises at least a first atom having a positive chemical valence and an oxygen atom chemically bonded to said first atom. It is a feature of the invention that the first atom and the oxygen atom constitute part of the deposited oxide thin film. A method in accordance with the invention may be used to form, without using an oxidizer, any oxide thin film of the integrated circuit art. It is particularly useful for forming a carbon-containing silicon oxide thin film.

In a method in accordance with the invention, the gaseous precursor stream may contain a plurality of precursor compounds and each precursor compound may contain one or several of the elements of the desired solid material of the final thin film. An important feature of a method and organic precursors in accordance with the invention, however, is that the oxygen atoms contained in the gaseous precursor are bound in a relatively unreactive form. Typically, the oxygen atoms are chemically bound to silicon in a precursor compound.

The invention may be used to deposit a premetal dielectric layer ("PMD"), an intermetal dielectric layer ("IMD"), an interlayer dielectric layer ("ILD"), a passivation layer and other insulator thin films having a low dielectric constant in an integrated circuit. The invention is most useful when applied to deposit a thin film of low dielectric constant, carbon-containing silicon oxide in a gap, or trench, between active devices or conductive interconnects in high density integrated circuits. It is also useful, however, in damascene process techniques.

The invention includes using a plasma-enhanced CVD technique to form an insulator thin film on a substrate. The plasma-enhanced CVD technique in accordance with the invention may be plasma-enhanced CVD ("PECVD") or high-density plasma CVD ("HDP-CVD"). The reactant gas mixture in the CVD reaction chamber comprises an inert plasma forming gas, such as argon. The reactant gas mixture may also comprise an inert carrier gas that carries the organic precursor compound, typically containing silicon, oxygen and carbon. The reactant gas mixture may also typically comprise organic solvent molecules. In PECVD, a high-frequency ("high F") radio frequency ("rf") is applied to the reactant gas mixture to form the plasma. In HDP-CVD, a low-frequency ("low F") rf is applied to the reactant gas mixture, and a high F rf is applied to the substrate wafer. PECVD may be used to deposit carbon-containing silicon oxide thin films in many applications, but not in so-called shallow trench isolation ("STI") or other aggressive gap fill applications, in which closely spaced, narrow gaps (trenches) are filled with low dielectric constant material. A method employing HDP-CVD is especially useful to fill isolator gaps having a gap width in the range of from 50 nm to 1000 nm and an aspect ratio in the range of from 1 to 3 or greater. In HDP-CVD, the plasma has a higher energy than in PECVD. Therefore, the recombination rate of reactive radicals in HDP-CVD is lower than in PECVD, and there is a higher concentration of reactive radicals at the substrate surface. As a result, the reaction rate to form a thin film on the substrate is higher in HDP-CVD than in PECVD. On the other hand, in HDP-CVD, the high F rf applied to the substrate results in sputter etching of the deposited thin film by highly energized radicals and inert gas molecules of the plasma. As a result, dielectric material deposited on the wafer surface is simultaneously sputter etched, helping to keep gaps open during the deposition process. This allows gaps with high aspect ratios of 3 and greater to be filled. Because of the simultaneous sputter etching occurring during thin film deposition in an HDP-CVD method in accordance with the invention, the problem of void formation during dielectric refill is alleviated.

DETAILED DESCRIPTION OF THE PREFERRED EMBODIMENT

1. Overview

It should be understood that FIGS. 1–2, 4–11, depicting integrated circuit devices fabricated in accordance with the invention, are not meant to be actual plan or cross-sectional views of any particular portions of actual integrated circuit devices. In actual devices, the layers will not be as regular and the thicknesses and widths may have different proportions. The various layers in actual devices often are curved and possess overlapping edges. Furthermore, the types and structures of circuit elements in actual integrated circuits that may be electrically isolated using a gap-filling method and precursors in accordance with the invention are varied and numerous. The figures, therefore, merely show idealized representations that are employed to depict more clearly and fully the use of the invention than would otherwise be possible.

Figure 1:
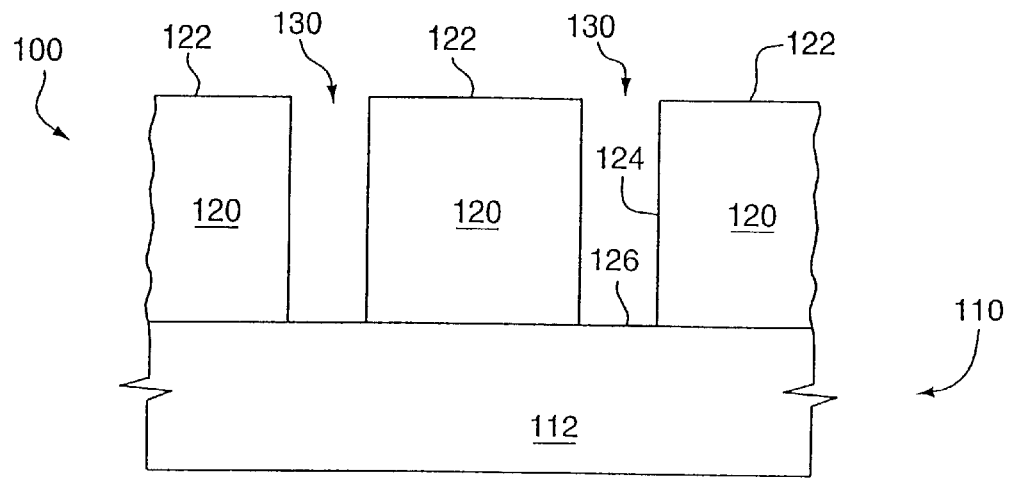
FIG. 1 is a cross-sectional view of an integrated circuit section having unfilled gaps before an inventive method and an inventive precursor are utilized to form a carbon-containing low-dielectric constant thin film.

FIG. 1 is a cross-sectional view of an integrated circuit section 100 before a method and a precursor in accordance with the invention are utilized to form a carbon-containing low-dielectric constant thin film. Section 100 includes a wafer substrate 110 comprising circuit elements 120 and underlying substrate 112, on which circuit elements 120 are located. Circuit elements 120 may be active circuit devices, such as transistors or memory capacitors. Circuit elements 120 typically are electrically conductive metal interconnects, such as interlevel local interconnects. Underlying substrate 112 may be a semiconductor substrate containing doped regions, such as transistor source or drain regions. Underlying substrate 112 may also include a plurality of layers, such as a conventional semiconductor substrate, interlayer dielectric layers, active circuit devices, and conductive interconnects. In section 100 of FIG. 1, gaps 130 have been formed to separate circuit elements 120. Wafer substrate 110 comprises surface 126, which is the bottom of gap 130, and surfaces 122 and 124, which are the exposed surfaces of circuit elements 120. To reduce cross-talk and parasitic capacitive coupling between circuit elements 120, and resulting speed degradation and power consumption, gaps 130 are preferably filled with carbon-containing low dielectric constant material. Gaps 130 have a gap width in the range of 100 nm to 1000 nm. In current preferred fabrication processes of the integrated circuit art, gaps 130 typically have a gap width in the range 200 nm to 600 nm. Gaps 130 typically have a gap depth less than 1000 nm. The gap aspect ratio, that is, the ratio of gap depth to gap width, is typically in the range of 1 to 6. In current preferred fabrication processes of the integrated circuit art, the aspect ratio is in the range of 2 to 3.5.

Figure 2:
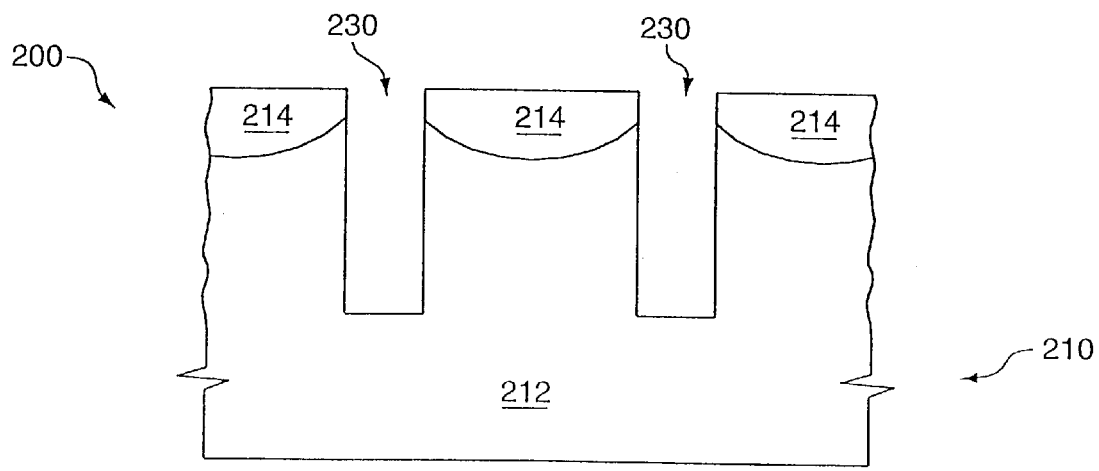
FIG. 2 depicts a cross-sectional view of an integrated circuit section 200 having unfilled trenches before the method and a precursor of the invention are utilized to form a carbon-containing low-dielectric constant thin film.

FIG. 2 depicts a cross-sectional view of an integrated circuit section 200 before the method and a precursor of the invention are utilized to form a carbon-containing low-dielectric constant thin film. Section 200 includes a wafer substrate 200 comprising semiconductor substrate 212 in which circuit elements 214 have been formed. Circuit elements 214 are typically doped regions of semiconductor substrate 212, for example, source or drain regions of MOSFETs. In section 200 of FIG. 2, trenches 230 have been formed to separate circuit elements 214. To reduce cross-talk and parasitic capacitive coupling between circuit elements 214, and resulting speed degradation and power consumption, trenches 230 are filled preferably with carbon-containing low dielectric constant material. Trenches 230 have a trench, or gap, width in the range of 100 nm to 1000 nm. In current preferred fabrication processes of the integrated circuit art, trenches 230 typically have a trench, or gap, width in the range of 200 nm to 600 nm. Trenches 230 typically have a depth less than 1000 nm. Trenches 230 may be referred to in this specification using the general term of "gaps", and the technique of filling the trenches 230 is generally referred to using the term "gap-filling" and related terms. The gap aspect ratio of trenches 230, that is, the ratio of trench depth to trench width, is typically in the range of 1 to 6. In current preferred fabrication processes of the integrated circuit art, the aspect ratio is in the range of 2 to 3.5.

The word "substrate" is used ambiguously in the art. It can refer to the semiconductor material on which the integrated circuit is formed, such as semiconductor substrate 212. It may also mean any object or surface on which a material layer is directly deposited. For example, in FIG. 1, circuit elements 120 are formed on underlying substrate 112, and in FIG. 4, discussed below, dielectric material is deposited on surfaces 122, 124 and 126 of wafer substrate 110. In this disclosure, "substrate" shall mean the object or surface to which the layer of interest is applied. The term "semiconductor substrate" generally refers to the initial semiconductor material of the starting wafer and its doped regions, such as semiconductor substrate 212. In this specification, wafer 110, 210, and specifically semiconductor substrate 212, typically comprise crystalline silicon semiconductor material; but the term "semiconductor substrate" may also refer to a GaAs, SiGe or other semiconductor materials.

Terms of orientation, such as "above", "top", "upper", "below", "bottom" and "lower" herein, mean relative to the flat direction of wafer 110, 210 in FIGS. 1–2, 4–10. For example, if a second element is "above" a first element, it means it is farther from substrate 112, 212. The flat dimension of substrate 112, 212 defines a substrate plane that is considered to be a "horizontal" plane herein, and directions perpendicular to this plane are considered to be "vertical". The terms "over" and "above" do not mean that a particular structure of layer is in direct contact with an underlying layer. For example, circuit element 120 might not necessarily contact the top surface of the semiconductor substrate contained in wafer 110 because there may be intervening layers and elements (not shown) in between. Similarly, the word "overlying" means that the overlying element is further from the substrate than the underlying element. It may or may not be in direct contact with an underlying layer. The term "on" is often used in the specification when referring to the deposition or formation of an integrated circuit layer onto an underlying substrate or layer. In contrast to "over" and "above", the terms "on" and "onto" generally signify direct contact, as is clear in the various contexts in which they are used. The terms "lateral" or "laterally" refer to the direction of the flat plane of the thin film. In FIG. 1, the lateral direction would be the horizontal direction. The vertical direction is normal, or perpendicular, to the horizontal direction. It is clear that circuit elements and carbon-containing low dielectric constant thin films can be fabricated with varying orientations relative to the horizontal and vertical.

The term "thin film" is used herein as it is used in the integrated circuit art. Generally, it means a film of less than a micron in thickness. Preferably, the gaps filled in accordance with the invention have a width of 100 nm to 1000 nm, and a depth not exceeding 1000 nm.

The term "trench", as used in the art, usually denotes a recess in a semiconductor substrate, typically formed by etching. The term "gap", as used in the art, usually refers to a spacing between circuit elements that have been formed on a wafer substrate on or above a semiconductor substrate, but it is sometimes used generally to include a "trench". The method and precursors of the invention may be used virtually identically to fill both trenches and gaps. This specification usually refers to filling "gaps" in applying a method and precursors of the invention. Nevertheless, it should be understood that the invention, as described in the claims, is equally applicable for filling trenches. In this specification, therefore, the term "gap" is used to include both trenches and gaps.

2. Detailed Description of the Method and Precursors

Figure 3:
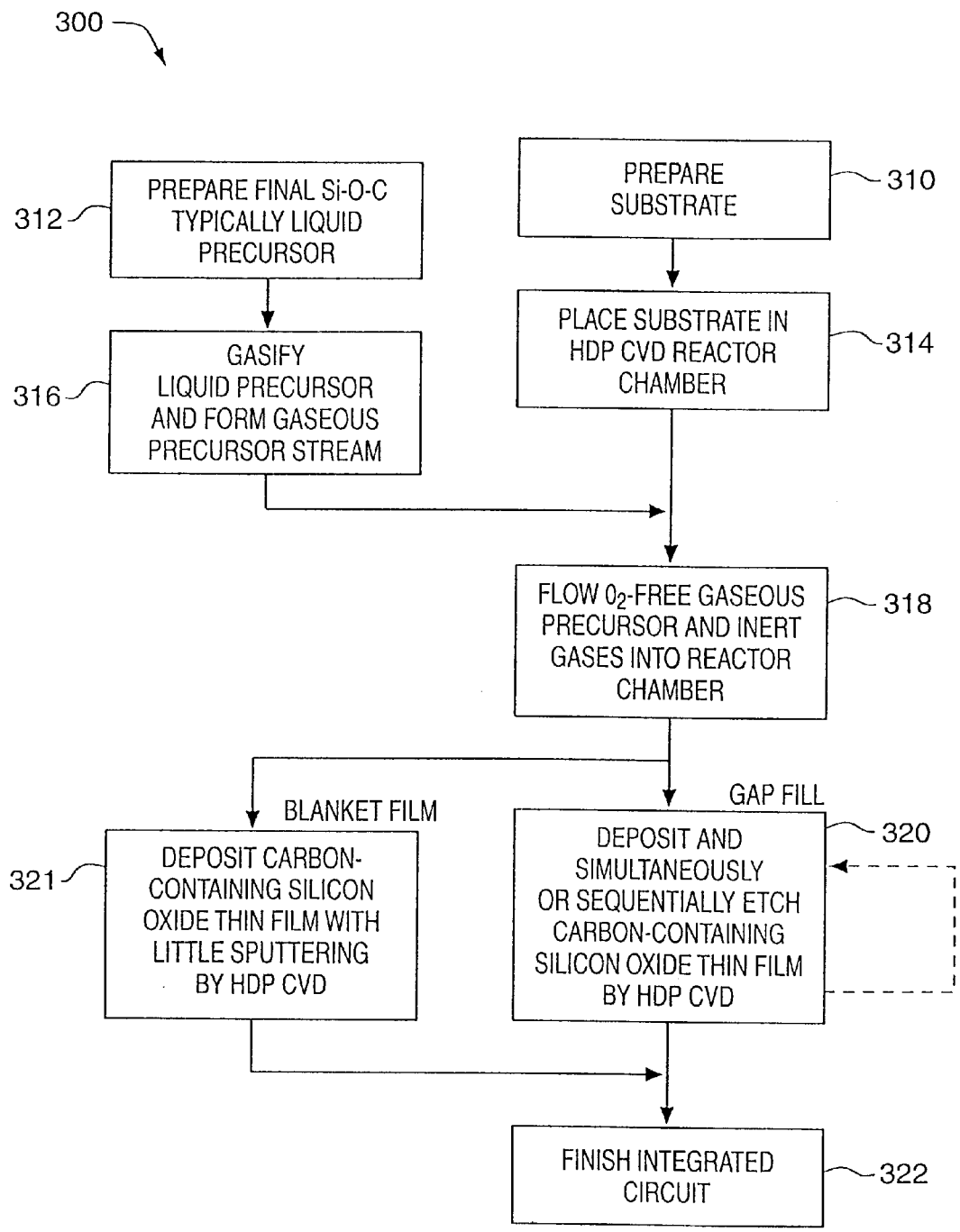
FIG. 3 is a process flow sheet of a preferred method for forming a thin film of low dielectric constant, carbon-containing silicon oxide material without the use of an oxidizer.
Figure 11:
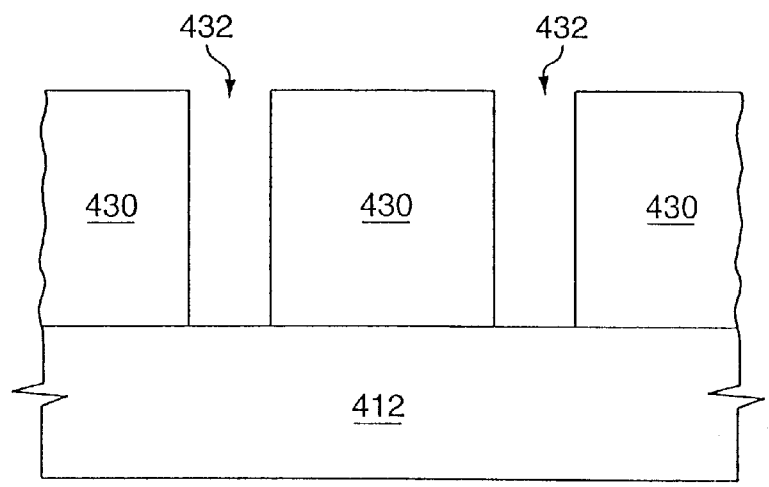
FIG. 11 is a cross-sectional view of an integrated circuit section having a blanket film deposited in a damascene process in accordance with the invention.

FIG. 3 is a process flow sheet of a preferred method 300 for forming a thin film of low dielectric constant, carbon-containing silicon oxide material without the use of an oxidizer. In particular, it is a flow sheet of an HDP-CVD method for filling a gap having an aspect ratio greater than 2 with carbon-containing silicon oxide material having a dielectric constant less than 3. Method 300 of FIG. 3 is described with reference to FIGS. 1, 4–9. It should be understood, however, that a method and precursors in accordance with the invention can be modified and applied to fabricate low dielectric constant insulating thin films to conform to shapes other than narrow gaps of FIGS. 1, 4–9. For example, interlevel dielectric layers may be fabricated using similar precursors in a PECVD or HDP-CVD reactor; or, a method in accordance with the invention using no oxidizer gas in a PECVD or HDP-CVD reactor may be used in a damascene process to apply a blanket film, as depicted in FIG. 11.

In step 310 of FIG. 3, substrate 112 is prepared. Step 310 comprises all prior fabrication processes, including fabrication of circuit elements 120, formation of doped regions and insulating layers (not shown), and all prior annealing, patterning, etching and cleaning steps. Finally, step 310 includes formation of gaps 130 using conventional patterning and etching steps. In step 312, a final liquid precursor solution containing moieties of silicon atoms, oxygen atoms and carbon atoms is prepared. It is a key feature of an inventive method that no reactive oxygen atoms are fed into the reaction chamber, where they could react with carbon atoms, effectively removing them from the deposited thin film, or react with hydrogen, forming OH—groups or water. The oxygen atoms for providing the oxygen of the silicon oxide material in the deposited thin film are provided, therefore, in the final liquid precursor, already chemically bound to silicon atoms. The silicon and oxygen are included in an organic precursor compound. It is possible for the carbon atoms to be provided in another organic precursor compound. Nevertheless, in the preferred method and in preferred inventive precursors, the silicon, oxygen and carbon atoms are all present in the same organic precursor compound. The preferred organic precursor compound is octamethylcyclotetrasiloxane, corresponding to the stoichiometric formula $(SiO(CH_3)_2)_4$. The organic precursor compounds may be prepared using a variety of standard conventional methods, or they may be purchased commercially.

In step 314, wafer 110 comprising substrate 112 is placed in the reaction chamber of an HDP-CVD apparatus. HDP-CVD apparati have been described in numerous publications, and most conventional apparati are suitable for carrying out the method of the invention. A preferred apparatus was described in U.S. Pat. No. 5,605,599, issued Feb. 25, 1997, to Benzing et al., which is hereby incorporated by reference as if fully contained herein. After the wafer is placed on the substrate holder, the pressure of the reaction chamber is maintained at a pressure in the range of 0.1 mTorr to 100 mTorr, preferably in the range of 5 mTorr to 15 mTorr. The temperature of the reaction chamber is maintained in the range of 0° C. to 200° C., preferably at 50° C. Argon or other plasma-forming gas is added to the reaction chamber at a flowrate in the range of 5 sccm to 100 sccm. In the reaction chamber, a low frequency (low F) rf field is applied, thereby forming a plasma. The argon serves to maintain plasma energy.

In step 316, the liquid precursor is gasified into an inert carrier gas, typically helium. Gasification may be achieved using one or a combination of several conventional techniques, including bubbling, ultrasound, misting and heating. The gasification occurs at low pressure, corresponding to the pressure of the reaction chamber, thereby making gasification easier. The preferred method of gasification is evaporation of the precursor at reactor chamber pressure. The flow rate of liquid precursor to the gasifying stage is in the range of 0.1 ml/min to 1.5 ml/min, preferably about 0.75 ml/min. The flow rate of inert carrier gas is in the range of 50 sccm to 1000 sccm, preferably about 150 sccm. A gaseous precursor compound may also be used in a method in accordance with the invention, in which case no gasification step 316 is necessary.

A key feature of the invention is that no oxidizing reactant gas ("oxidizer") is added to the gaseous precursor stream or the reaction chamber. In contrast to the present invention, CVD deposition methods of the prior art added a gaseous oxidizer to the reaction chamber. Conventional prior art oxidizers are reactive oxygen compounds, such as $O_2$, $O_3$, $N_2O$, $NO_2$ and others. These reactive oxidizers used in the prior art serve to oxidize silicon, but they also oxidize carbon and whatever hydrogen may be present.

In step 318, the oxidizer-free gaseous precursor stream is fed into the reaction chamber. The gaseous precursor stream and other gases added to the reactor form the reactant gas mixture.

The low F source has a frequency typically in the range of from 200 kHz to 1000 kHz, preferably about 450 kHz, and a power in the operating range of 200 watts to 1000 watts, preferably about 500 watts. Further, a high frequency (high F) rf source is connected to the wafer holder. The high F source has a frequency typically in the range of from 8 MHz to 20 MHz, preferably about 13.56 MHz, and a power in the operating range of about 500 watts to 1500 watts. Preferably, the high F rf source has an internal dc bias control that allows a regulated bias voltage at the wafer to be achieved. The high F power and bias are determined by desired film properties.

Figure 4:
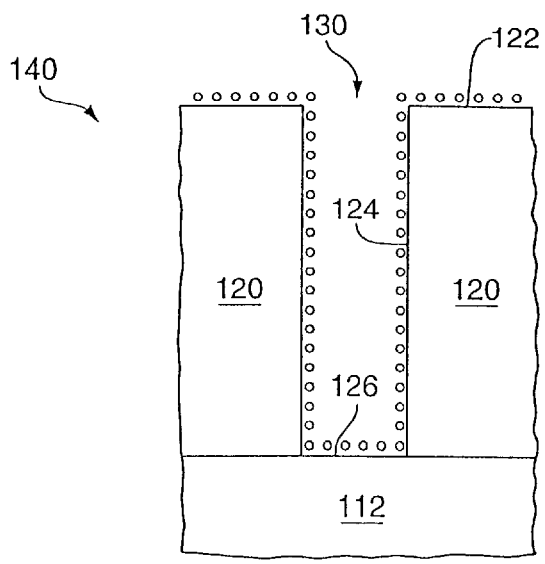
FIG. 4 is an enlarged representation of a portion of the section from FIG. 1, in which material formed in the plasma reaction deposits on all exposed surfaces of the wafer substrate.
Figure 5:
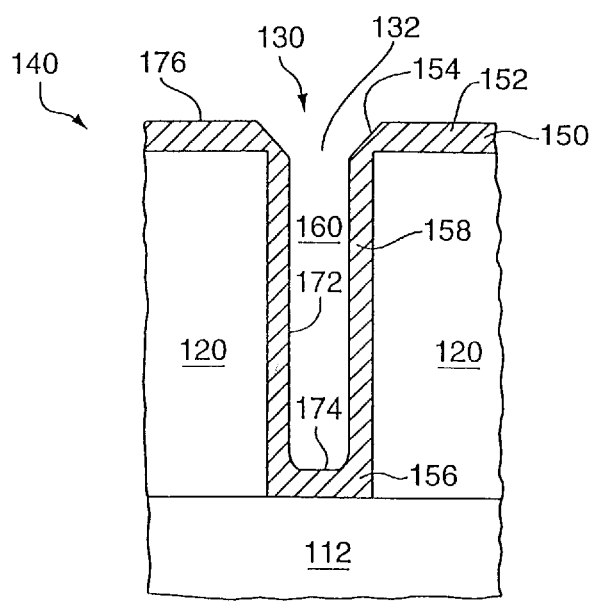
FIG. 5 depicts a further intermediate stage of deposition and etching of material onto the portion of FIG. 4, in which facets form at the corners of the circuit elements due to preferential etching, thereby preventing the gap opening from being prematurely closed off by deposited material.
Figure 6:
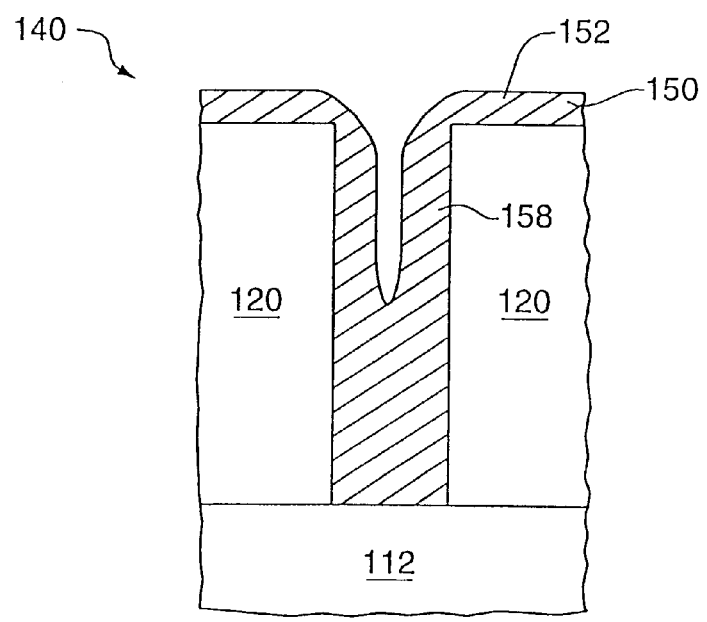
FIG. 6 depicts a further intermediate stage in the fabrication of the portion of FIG. 5, in which the gap is almost filled.

In step 320, the low F rf field is applied to the reactant gas mixture and the resulting plasma, while the high F rf power is applied to the wafer holder. The plasma causes the organic precursor compound to dissociate into reactive radicals that react at the substrate surface, resulting in deposition of carbon-containing low dielectric constant silicon oxide material. FIG. 4 is an enlarged representation of a portion 140 of section 100 from FIG. 1. As depicted in FIG. 4, the material formed in the plasma reaction deposits on all exposed surfaces of the wafer substrate: it deposits on surfaces 124 and 126, which are the side walls and bottom, respectively, of gap 130, and it deposits on top surface 122 of circuit element 120. A key feature of an inventive method is that deposition and sputtering of the carbon-containing low dielectric constant silicon oxide material ("the material") may occur simultaneously at the wafer substrate. The sputtering of the material occurs as a result of the high F rf bias applied to the substrate holder. Gas molecules that have been ionized in the high density plasma, particularly argon, accelerate toward the wafer substrate surface when the bias is applied to the substrate. Material is thereby sputter etched when the ions strike the surface. As a result, the material is sputter etched to help keep gaps open during the deposition process. This is illustrated with the aid of FIG. 5. FIG. 5 depicts a further intermediate stage of deposition of material onto portion 140. As deposition proceeds, an intermediate stage of thin film 150 of the material forms. Because the etch rate at an angle of 45° is approximately three to four times greater than the etch rate on the horizontal portion 152 of thin film 150, facets 154 form at the corners of circuit elements 120 during the deposition process. As a result, gap opening 132 at the top of gap 130 proximate to the corners of circuit elements 120 is not prematurely closed off by deposited material. Plasma can still penetrate into interior space 160 of gap 130 so that the thickness of bottom portion 156 and side portions 158 of thin film 150 can continue to grow to fill gap 130. Also, since the etch rate from side surface 172 and bottom surface 174 of thin film 150 lining the interior space 160 of gap 130 is slower than at top surface 176 and at facets 154, the thickness of thin film 150 in the interior of gap 130 grows relatively rapidly. Also, because the line-of-sight paths for material etched from bottom surface 174 and side surfaces 172 to an adjacent surface become increasingly shorter, more and more of the material etched from these interior surfaces redeposits itself in the interior of the gap, thus filling the gap further. This progress is illustrated in FIG. 6, which depicts a further intermediate stage in the fabrication of portion 140 in which gap 130 is almost filled.

By varying, in step 320, the high F rf bias applied to the wafer, the method in accordance with the invention minimizes the amount of sputtering to which the wafer substrate is exposed. The dashed line in FIG. 3 indicates that the high F rf bias may be varied during the course of the deposition and sputtering process.

In an embodiment in accordance with the invention in which a blanket film is deposited, step 320 is not followed. Instead, in alternate step 321, a blanket thin film is deposited using little or no sputtering by high F rf bias.

Preferably, the high F rf bias is varied when depositing a gap-filling thin film. Preferably, it is varied by applying it pulse-wise to the wafer. The length of time the bias is switched on and the length of time it is switched off can be controlled to accomplish just enough sputtering to keep gap opening 132 open. The on and off times are determined by the maximum thickness that can be deposited without causing the gap to begin to close. Once the maximum thickness is reached, the bias is switched on, and the corners of the gap at the facet surfaces are preferentially sputtered. The deposition rate of the dielectric material and its sputtering rate, the bias pulse on and off times, and the pulse magnitude are all interrelated and need to be optimized for each gap geometry, reactor type and desired material properties. The pulse shape can be constant throughout the deposition process, or it can be varied. The rf bias may be continuous and uniform initially, and then the pulsed bias may be started after some material has already deposited; or the bias may be applied pulse-wise at the beginning of the plasma deposition process. A pulse trigger device may be used to control the bias source. For filling a gap with a 0.24 μm opening width and an aspect ratio of 2.5 using the operating conditions described above, the bias pulse is switched off for about 2 seconds to 5 seconds during plasma deposition. Then, during a pause of about 5 seconds, the precursor compound gases are cleared from the system, while an inert sputter gas, usually argon, is flowed into the chamber. The high F rf bias is switched on for about 40 seconds to sputter the thin film. Then the cycle is repeated until the gap is filled and the desired thin film thickness is achieved.

Alternatively, the high F rf bias may be varied by tailoring the magnitude of the bias. Preferably, the magnitude of the bias is decreased from about 5 kW to about zero kW during the course of the deposition process. As the gap is filled, the power of the bias is decreased. Preferably, both techniques, that is, bias pulsing and bias tailoring, are used to minimize sputtering of the wafer substrate surface.

Figure 7:
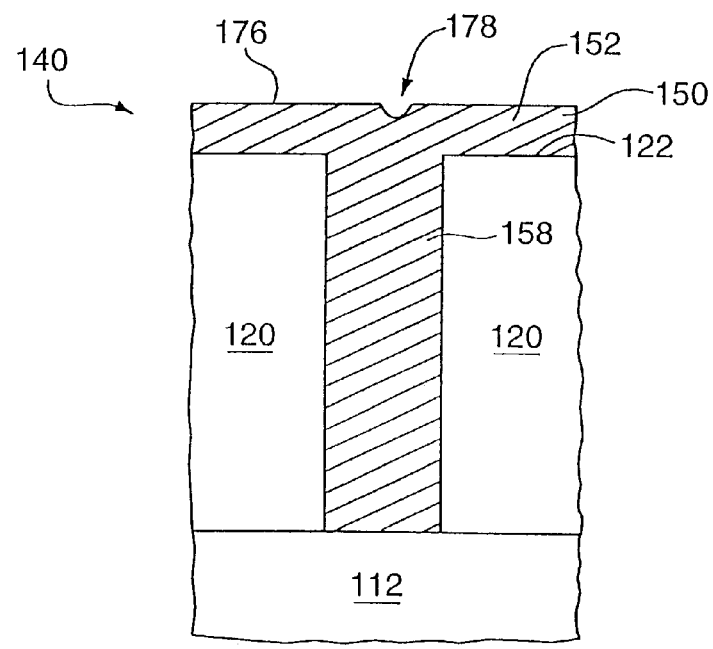
FIG. 7 depicts the portion of FIG. 6 after the HDP-CVD sputtering and etching techniques have been completed.

FIG. 7 depicts portion 140 when the HDP-CVD sputtering and etching techniques of step 320 have been completed. Gap 130 is filled by carbon-containing low dielectric constant silicon oxide thin film 150. The horizontal portion 152 of thin film 150 also covers other previously exposed top surface 122 of circuit element 120.

Figure 8:
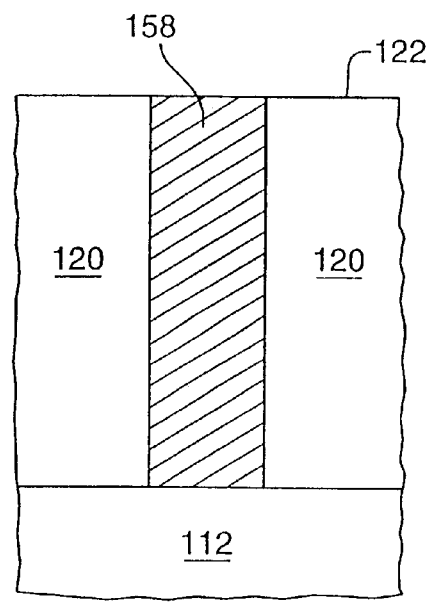
FIG. 8 shows the portion of FIG. 7 in which the horizontal portion of the deposited thin film has been removed down to the top surface of the circuit element.
Figure 9:
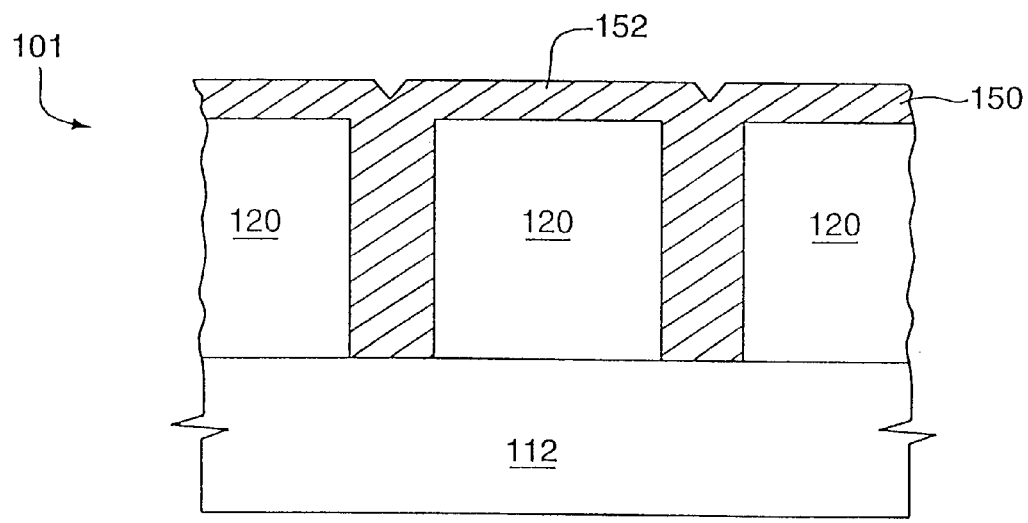
FIG. 9 shows the section from FIG. 1 in which the horizontal portion of the deposited thin film is retained so that it forms a layer between the circuit elements and overlying circuit structures (not depicted)
Figure 10:
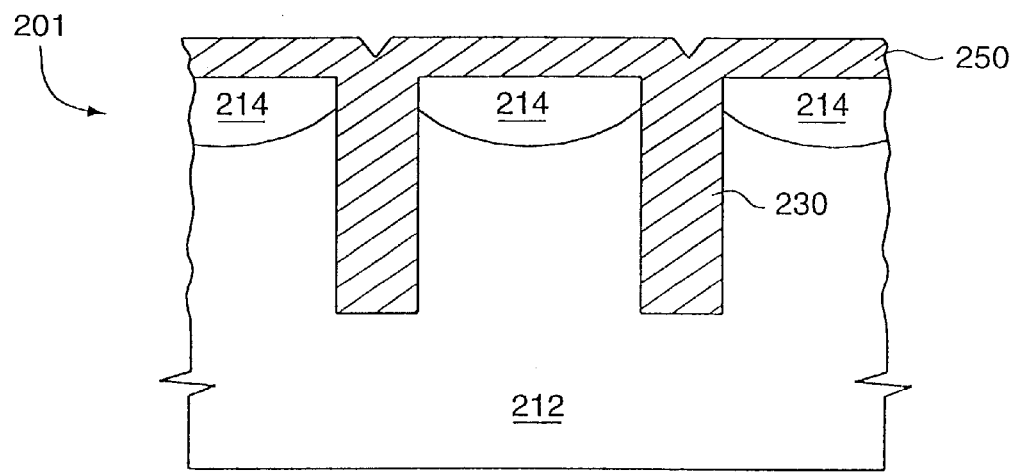
FIG. 10 shows the section in which trenches of the section of FIG. 2 have been filled using the method and a precursor of the invention.

The integrated circuit is completed in step 324, which may include re-utilization of this invention and conventional steps of: adding dielectric layers, active circuit elements, conductive interconnects; patterning, etching and annealing; and packaging. As depicted in FIGS. 7 and 8, horizontal portion 152 of thin film 150 may be removed completely or partially using conventional techniques to expose surface 122 of circuit element 120; or, as depicted in FIG. 9, portion 152 may be retained to serve as an insulating layer in integrated circuit section 101. FIG. 10 depicts a section 201, which is a later stage of section 200 of FIG. 2, in which the invention was applied to deposit thin film 250 and fill trenches, or gaps, 230 in semiconductor substrate 212.

FIG. 11 is a cross-sectional view of an integrated circuit section 400 having a blanket film 430 deposited in a damascene process in accordance with the invention. Section 400 comprises a substrate 412 on which a thin film of low dielectric constant, carbon-containing silicon oxide material is deposited in accordance with the invention. Because it is not necessary to fill gaps, blanket film 430 is deposited using a PECVD or HDP-CVD method in accordance with the invention in which there is little sputter etching of the dielectric material during deposition. Blanket film 430 then is typically patterned and etched, to form gaps 432, which are then typically filled with a conductive interconnect material. When a method in accordance with the invention is used to deposit a blanket film or other non-gap-filling thin film, then the high F rf bias of steps 320, 322 may be eliminated entirely.

EXAMPLE 1

In a laboratory-scale embodiment of the invention, a gap with a 0.24 μm opening width and an aspect ratio of 2.5 was filled with carbon-containing silicon oxide having a dielectric constant of 3.3 in the gap. A silicon substrate having 0.24 μm features was placed in the HDP-CVD reaction chamber. A liquid precursor comprising octamethylcyclotetrasiloxane, corresponding to the stoichiometric formula $(SiO(CH_3)_2)_4$, was gasified at a rate of 0.75 ml/min into helium carrier gas having a flowrate of 150 sccm. The gaseous precursor stream was fed into the reaction chamber, which had a pressure of approximately 10 mTorr. The silicon substrate wafer was clamped and cooled with hydrogen gas to maintain a temperature during deposition of less than 200° C. Argon gas at a flowrate of 30 sccm was fed into the reaction chamber. Low F rf at 500 watts was applied at all times, thereby forming a plasma. The gaseous precursor stream was delivered to the reaction chamber for about three seconds to deposit carbon-containing silicon dioxide in the gaps and on the substrate. Then, during the next seven seconds, the precursor chemistry was cleared from the reaction chamber, but the low F rf and the argon flow of 30 sccm were maintained. A high F rf bias of 1000 watts was switched on for about 40 seconds to sputter the thin film. The cycle was repeated until the gap was filled and the desired thin film thickness achieved. The dielectric constant in the filled gaps was 3.3.

There has been described a novel method and precursors for fabricating carbon-containing low dielectric constant silicon oxide thin films in integrated circuits. A method and precursors in accordance with the invention are especially useful for filling gaps having high aspect ratios with low dielectric constant material. The novel method uses chemical vapor deposition techniques, in which an organic liquid precursor solution containing one or more organic precursor compounds is applied to the surface of an integrated circuit wafer substrate. The invention encompasses novel compositions of organic precursor compounds for plasma-enhanced CVD formation of carbon-containing low dielectric constant thin films. It should be understood that the particular embodiments shown in the drawings and described within this specification are for purposes of example and should not be construed to limit the invention, which will be described in the claims below. For example, the invention contemplates that the organic precursor compounds and solutions of the invention may comprise a wide range of different types of organic compounds that can be dissociated and deposited using CVD techniques. Similarly, the carbon-containing silicon oxide thin films may comprise materials of various compositions and thicknesses. It is evident that those skilled in the art may now make numerous uses and modifications of the specific embodiments described, without departing from the inventive concepts. It is also evident that the steps recited may, in some instances, be performed in a different order; or equivalent structures and processes may be substituted for the structures and processes described. Consequently, the invention is to be construed as embracing each and every novel feature and novel combination of features present in and/or possessed by the fabrication methods and compositions described.

What is claimed is:

1. A method for forming an oxide thin film during integrated circuit fabrication, comprising steps of:

providing a substrate in a reaction chamber;

providing a reactant gas mixture in said reaction chamber, wherein said reactant gas mixture and said reaction chamber do not contain an oxidizer; and reacting said reactant gas mixture in said reaction chamber to deposit oxide material on said substrate.

2. A method as in claim 1 wherein said oxide thin film is a low dielectric constant carbon-containing silicon oxide thin film.

3. A method as in claim 1 wherein said reactant gas mixture comprises moieties of silicon atoms, oxygen atoms and carbon atoms, said oxygen atoms being chemically bonded to said silicon atoms.

4. A method as in claim 3 wherein said reactant gas mixture comprises an organic precursor compound, said organic precursor compound containing a first atom having a positive chemical valence and an oxygen atom chemically bonded to said first atom.

5. A method as in claim 4 wherein said reactant gas mixture comprises an organic precursor compound, said organic precursor compound containing a silicon atom and an oxygen atom chemically bonded to said silicon atom.

6. A method as in claim 5 wherein said organic precursor compound contains a carbon atom.

7. A method as in claim 6 wherein said carbon atom is part of an alkyl group.

8. A method as in claim 7 wherein said organic precursor compound is octamethylcyclotetrasiloxane, corresponding to the stoichiometric formula $(SiO(CH_3)_2)_4$.

9. A method as in claim 1 wherein said reactant gas mixture comprises an inert gas.

10. A method as in claim 9 wherein said inert gas is selected from the group consisting of argon and helium.

11. A method as in claim 1 wherein said step of reacting said reactant gas mixture includes forming a plasma in said reaction chamber from said reactant gas mixture.

12. A method as in claim 11 wherein said step of forming a plasma from said reactant gas mixture includes applying a low-frequency radio frequency to said reactant gas mixture.

13. A method as in claim 12 wherein said low-frequency radio frequency has a frequency in the range of from 200 kHz to 1000 kHz.

14. A method as in claim 11 wherein said method is a plasma enhanced chemical vapor deposition (PECVD) method.

15. A method as in claim 11 wherein said method is a high density plasma chemical vapor deposition (HDP-CVD) method.

16. A method as in claim 11, further comprising a step of applying a high-frequency radio frequency to said substrate.

17. A method as in claim 16 wherein said high-frequency radio frequency has a frequency in the range of from 8 MHz to 20 MHz.

18. A method as in claim 16 wherein said plasma in said reaction chamber is at a pressure in the range of from 0.1 mTorr to 50 mTorr.

19. A method as in claim 16 wherein said plasma in said reaction chamber is at a pressure in the range of from 5 mTorr to 15 mTorr.

20. A method as in claim 16 wherein said step of applying a high-frequency radio frequency to said substrate results in sputter etching of said carbon-containing silicon oxide material.

21. A method as in claim 1 wherein said substrate contains a gap, and said oxide thin film fills said gap.

22. A method as in claim 21 wherein said gap is a trench formed in a semiconductor substrate.

23. A method as in claim 21 wherein said substrate comprises integrated circuit elements, and said gap is disposed between said circuit elements.

24. A method as in claim 21 wherein said gap has an aspect ratio in the range of from 2 to 6.

25. A method as in claim 21 wherein said gap has a gap width in the range of from 100 nm to 1000 nm.

26. A method as in claim 1 wherein said oxide thin film has a dielectric constant less than the dielectric constant of silicon dioxide.

27. A method as in claim 26 wherein said oxide thin film has a dielectric constant less than 4.

28. A method as in claim 26 wherein said oxide thin film has a dielectric constant less than 3.5.

29. A method as in claim 26 wherein said oxide thin film has a dielectric constant less than 3.

30. A method as in claim 11, further comprising steps of: applying a variable high-frequency rf bias to said substrate; and varying said variable high frequency rf bias.

31. A method as in claim 30 wherein said variable high frequency rf bias has a frequency in the range from 8 MHz to 20 MHz.

32. A method as in claim 30 wherein said varying of said variable high frequency rf bias comprises applying said variable high frequency rf bias as a pulse, wherein said bias is switched on for a length of time and switched off for a length of time.

33. A method as in claim 32 wherein said bias is switched on for a length of time in the range of from 1 second to 100 seconds.

34. A method as in claim 32 wherein said bias is switched on for a length of time in the range of from 30 seconds to 50 seconds.

35. A method as in claim 32 wherein said bias is switched off for a length of time in the range of from 1 second to 20 seconds.

36. A method as in claim 32 wherein said bias is switched off for a length of time in the range of from 1 second to 5 seconds.

37. A method as in claim 30 wherein said variable high frequency rf bias has a variable magnitude, and said varying of said variable high frequency rf bias comprises tailoring said variable high frequency bias by varying said magnitude of said bias.

38. A method as in claim 37 wherein said variable magnitude is variable in the range of from 5 kW to zero kW.

39. A method as in claim 38 wherein said varying of said magnitude comprises decreasing said magnitude from 1000 watts to zero watts.

* * * * *